(12) United States Patent
Lee et al.

(10) Patent No.: US 9,608,231 B2
(45) Date of Patent: Mar. 28, 2017

(54) DISPLAY APPARATUS

(71) Applicant: LG ELECTRONICS INC., Seoul (KR)

(72) Inventors: Moungyoub Lee, Seoul (KR); Sangdon Park, Seoul (KR); Choongsuk Park, Seoul (KR); Inkeun Ryu, Seoul (KR); Hyukjin Nam, Seoul (KR); Seunghyun Yun, Seoul (KR); Jaehyun Sung, Seoul (KR); Jaegi Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/091,127

(22) Filed: Apr. 5, 2016

(65) Prior Publication Data

US 2016/0218316 A1    Jul. 28, 2016

Related U.S. Application Data

(63) Continuation of application No. 13/711,408, filed on Dec. 11, 2012.

(30) Foreign Application Priority Data

Dec. 19, 2011 (KR) .................. 10-2011-0137751
Nov. 19, 2012 (KR) .................. 10-2012-0131217

(51) Int. Cl.
*G02F 1/00*    (2006.01)
*H01L 51/52*    (2006.01)
(Continued)

(52) U.S. Cl.
CPC .... *H01L 51/5237* (2013.01); *G02F 1/133608* (2013.01); *G06F 1/1601* (2013.01);
(Continued)

(58) Field of Classification Search
CPC ........ G02F 2001/133308; G02F 2001/133317; G02F 2001/133322; G02F 2001/13328;
(Continued)

(56) References Cited

U.S. PATENT DOCUMENTS 5,020,765 A    6/1991    Evans et al.
6,332,690 B1    12/2001    Murofushi
(Continued)

FOREIGN PATENT DOCUMENTS

CN    1618091 A    5/2005
CN    1714379 A    12/2005
(Continued)

OTHER PUBLICATIONS

International Search Report dated Apr. 22, 2013 issued in Application No. PCT/KR2012/010857.
(Continued)

*Primary Examiner* — Andrew Coughlin
*Assistant Examiner* — Zheng Song
(74) *Attorney, Agent, or Firm* — Ked & Associates, LLP

(57) ABSTRACT

Provided is a display apparatus. The display apparatus includes a display panel, a back cover disposed on a rear side of the display panel, the back cover having a curved shape of which both ends protrude forward, and a fixing part fixing the back cover to maintain the curved shape of the back cover. The display panel is curved in a shape corresponding to that of the back cover.

19 Claims, 17 Drawing Sheets

(51) Int. Cl.
| | | |
|---|---|---|
| *H05K 5/03* | (2006.01) | |
| *G09F 13/04* | (2006.01) | |
| *G02F 1/1335* | (2006.01) | |
| *G09F 9/30* | (2006.01) | |
| *G09F 9/33* | (2006.01) | |
| *G09F 9/35* | (2006.01) | |
| *H05K 5/00* | (2006.01) | |
| *H05K 5/02* | (2006.01) | |
| *G06F 1/16* | (2006.01) | |
| *G06F 1/20* | (2006.01) | |
| *H04N 5/64* | (2006.01) | |
| *H05K 1/02* | (2006.01) | |
| *G02F 1/1333* | (2006.01) | |

(52) U.S. Cl.
CPC ............. *G06F 1/20* (2013.01); *G09F 9/301* (2013.01); *G09F 9/33* (2013.01); *G09F 9/35* (2013.01); *G09F 13/04* (2013.01); *H04N 5/64* (2013.01); *H05K 1/0281* (2013.01); *H05K 5/0017* (2013.01); *H05K 5/0217* (2013.01); *H05K 5/03* (2013.01); *G02F 1/133308* (2013.01); *G02F 2001/133314* (2013.01); *G02F 2001/133317* (2013.01); *G06F 2200/1612* (2013.01); *H05K 2201/056* (2013.01); *H05K 2201/10128* (2013.01)

(58) Field of Classification Search
CPC ......... G02F 2201/46; G02F 2013/0481; G09F 9/301
USPC ........... 362/600–634, 97.1–97.4; 349/58–60; 361/679.01–679.61
See application file for complete search history.

(56) References Cited

U.S. PATENT DOCUMENTS

| | | | |
|---|---|---|---|
| 6,364,260 | B1 | 4/2002 | Lorincz |
| D497,166 | S | 10/2004 | Vick |
| 7,542,286 | B2 * | 6/2009 | Kang .................. G06F 1/1601 361/690 |
| 7,551,432 | B1 | 6/2009 | Bockheim et al. |
| 7,567,436 | B2 | 7/2009 | Jeong |
| 7,791,279 | B2 | 9/2010 | Kwon et al. |
| 2002/0003591 | A1 | 1/2002 | Giannatto |
| 2002/0071066 | A1 | 6/2002 | Silverbrook |
| 2003/0174259 | A1 | 9/2003 | Yang |
| 2005/0088839 | A1 | 4/2005 | Huang |
| 2005/0180098 | A1 | 8/2005 | Kim |
| 2005/0184631 | A1 | 8/2005 | Kim |
| 2005/0194913 | A1 | 9/2005 | Kim et al. |
| 2005/0258726 | A1 * | 11/2005 | Bang ........................ H05K 5/02 313/49 |
| 2005/0264985 | A1 | 12/2005 | Kim et al. |
| 2006/0038745 | A1 | 2/2006 | Naksen et al. |
| 2006/0044746 | A1 | 3/2006 | Kim et al. |
| 2006/0133017 | A1 | 6/2006 | Bang |
| 2007/0085961 | A1 | 4/2007 | Jeong et al. |
| 2007/0127198 | A1 | 6/2007 | Cho |
| 2007/0195221 | A1 | 8/2007 | Won |
| 2008/0204621 | A1 * | 8/2008 | Chang ................. B60R 11/0235 349/58 |
| 2008/0212270 | A1 * | 9/2008 | Choi ...................... G06F 1/182 361/752 |
| 2009/0059563 | A1 | 3/2009 | Takata et al. |
| 2009/0086119 | A1 | 4/2009 | Hiradate et al. |
| 2009/0096965 | A1 | 4/2009 | Nagata |
| 2009/0161048 | A1 | 6/2009 | Satake et al. |
| 2009/0201443 | A1 | 8/2009 | Sasaki et al. |
| 2010/0059647 | A1 * | 3/2010 | Hu ......................... F16M 11/26 248/346.06 |
| 2010/0073593 | A1 | 3/2010 | Sasaki et al. |
| 2010/0195040 | A1 | 8/2010 | Koganezawa |
| 2011/0084898 | A1 | 4/2011 | Ebbeling et al. |
| 2011/0096262 | A1 | 4/2011 | Kikuchi |
| 2011/0116219 | A1 | 5/2011 | Delva et al. |
| 2011/0140995 | A1 | 6/2011 | Hamers et al. |
| 2011/0155868 | A1 | 6/2011 | Sun et al. |
| 2011/0222220 | A1 | 9/2011 | Murakata |
| 2011/0249425 | A1 | 10/2011 | Aurongzeb et al. |
| 2012/0281367 | A1 | 11/2012 | He et al. |
| 2012/0320509 | A1 | 12/2012 | Kim et al. |
| 2013/0044411 | A1 | 2/2013 | Zhen et al. |
| 2013/0107159 | A1 | 5/2013 | Cheng |
| 2013/0114193 | A1 | 5/2013 | Joo et al. |
| 2013/0114196 | A1 | 5/2013 | Chen |
| 2013/0128544 | A1 | 5/2013 | Kuo et al. |
| 2013/0265765 | A1 | 10/2013 | Liang et al. |
| 2013/0329162 | A1 | 12/2013 | Fujii et al. |
| 2013/0329422 | A1 | 12/2013 | Park et al. |
| 2014/0226266 | A1 | 8/2014 | Kang et al. |

FOREIGN PATENT DOCUMENTS

| | | |
|---|---|---|
| CN | 1949309 A | 4/2007 |
| CN | 201060610 Y | 5/2008 |
| CN | 101915999 A | 12/2010 |
| CN | 102043444 A | 5/2011 |
| CN | 102077263 A | 5/2011 |
| CN | 102239683 A | 11/2011 |
| JP | 10-026754 A | 1/1998 |
| JP | H 10-268790 A | 10/1998 |
| JP | 2001-034205 A | 2/2001 |
| JP | 2005-331872 A | 12/2005 |
| JP | 2006-023676 A | 1/2006 |
| JP | 2009-063640 A | 3/2009 |
| JP | 2009-109812 A | 5/2009 |
| JP | 10-2009-0072726 A | 7/2009 |
| KR | 10-0659075 | 12/2006 |
| KR | 10-2011-0100537 A | 9/2011 |
| KR | 10-1319543 | 10/2013 |
| KR | 10-2014-0061803 A | 5/2014 |
| TW | 534420 U | 5/2003 |
| WO | WO 2009/148313 A1 | 12/2009 |
| WO | WO 2011/108848 A2 | 9/2011 |

OTHER PUBLICATIONS

Korean Office Action dated Feb. 11, 2014.
Korean Notice of Allowance issued in related Application No. 10-2011-0137751 dated Apr. 28, 2014.
European Search Report dated Aug. 21, 2014 issued in Application No. 12861035.9 (Full English Text).
European Search Report dated Aug. 22, 2014 issued in Application No. 14002354.0 (Full English Text).
Korean Office Action dated Oct. 24, 2014 issued in Application No. 10-2012-0131217.
U.S. Office Action dated Nov. 4, 2014 issued in co-pending U.S. Appl. No. 13/711,408.
Office Action dated Dec. 15, 2014, issued in U.S. Appl. No. 14/276,778.
U.S. Office Action issued in a co-pending U.S. Appl. No. 14/276,778 dated Mar. 19, 2015.
U.S. Final Office Action dated Apr. 29, 2015 issued in co-pending U.S. Appl. No. 13/711,408.
Chinese Office Action issued in Application No. 201280043401.4 dated Aug. 6, 2015.
U.S. Office Action issued in co-pending U.S. Appl. No. 14/276,778 dated Aug. 13, 2015.
U.S. Office Action dated Oct. 30, 2015 issued in co-pending U.S. Appl. No. 13/711,408.
Chinese Office Action dated Nov. 23, 2015 issued in Application No. 201410319171.0. (English Translation attached).
Chinese Office Action dated Mar. 8, 2016 issued in Application No. 201280043401.4.
U.S. Final Office Action dated Jun. 28, 2016 issued in co-pending U.S. Appl. No. 13/711,408.

(56) References Cited

OTHER PUBLICATIONS

U.S. Office Action dated Nov. 17, 2016 issued in co-pending U.S. Appl. No. 13/711,408.

* cited by examiner

DISPLAY APPARATUS

CROSS-REFERENCE TO RELATED APPLICATIONS

The present application is a Continuation of co-pending U.S. patent application Ser. No. 13/711,408 filed on Dec. 11, 2012, which claims priority under 35 U.S.C. 119(a) to Korean Patent Application Nos. 10-2011-0137751, filed on Dec. 19, 2011 and 10-2012-0131217, filed on Nov. 19, 2012, whose entire disclosures are hereby incorporated by reference.

BACKGROUND

The present disclosure relates to a display apparatus.

As an information-oriented society develops, needs for diverse forms of display apparatuses are increasing. Accordingly, research has been carried out on various display apparatuses such as liquid crystal display devices (LCDs), plasma display panels (PDPs), electro luminescent displays (ELDs), vacuum fluorescent displays (VFDs), and the like, which have been commercialized.

Also, researches with respect to three-dimensional (3D) images are being carried out in recent years. 3D image technologies are being generalized and commercialized in various environments and techniques as well as computer graphic fields.

SUMMARY

Embodiments provide a display apparatus having a structure through which user's immersion is improved.

In one embodiment, a display apparatus includes: a display panel; a back cover disposed on a rear side of the display panel, the back cover having a curved shape of which both ends protrude forward; and a fixing part fixing the back cover to maintain the curved shape of the back cover, wherein the display panel is curved in a shape corresponding to that of the back cover.

The details of one or more embodiments are set forth in the accompanying drawings and the description below. Other features will be apparent from the description and drawings, and from the claims.

DETAILED DESCRIPTION OF THE EMBODIMENTS

Figure 1:
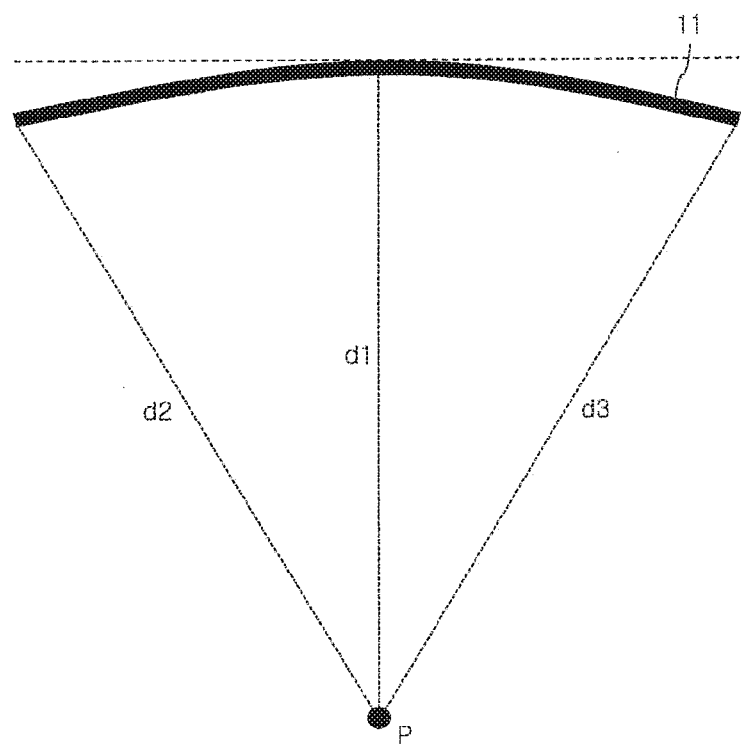
FIG. 1 is a schematic view of a display panel according to an embodiment.

Exemplary embodiments of the present disclosure will now be described with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

Although an organic light emitting display (OLED) is described below as an example of a display panel, the display panel applicable to the present disclosure is not limited to a liquid crystal panel. For example, the display panel may include various flat panel display panels such as liquid crystal display devices (LCDs), plasma display panels (PDPs), or filed emission display (FEDs).

FIG. 1 is a schematic view of a display panel according to an embodiment.

Referring to FIG. 1, a display panel 11 provided in a display apparatus 1 according to an embodiment may have a curved shape with a predetermined curvature R.

For example, the curved shape of the display panel 11 may have the curvature R so that distances d1, d2, and d3 between a watching position P of a user and a front surface of the display panel 11 are equal or similar to each other. The display panel 11 may have a curved shape with the predetermined curvature R.

Thus, when the user watches an image displayed on the display apparatus 1, the user's immersion may be improved. Particularly, as described above, when the user watches a 3D image, the user's immersion may be significantly improved by the curved shape of the display panel 11.

An OLED panel using an organic light emitting device (OLED) may be used as the display panel 11.

The OLED has a structure in which an organic light emitting layer having a functional thin film shape is inserted between an anode electrode and a cathode electrode. Also, the OLED may be a device in which holes are injected into the anode electrode, and electrons are injected into the cathode, and then the electrons and the holes are combined within the organic light emitting layer to form excitons, thereby generating light while the excitons emit light and are recombined with each other.

A method for realizing a full color OLED may include an independent light emitting method, a color filter method, or a color conversion method. The independent light emitting method may be a method for realizing light having R, G, and B colors by thermally depositing light emitting materials respectively having the R, G, and B colors using a metal shadow mask on which the light emitting materials are precisely patterned. The cooler filter method may be a method in which a while light emitting layer is provided, and R, G, and B color filters are patterned to realize light having R, G, and B colors. The color conversion method may be a method in which a blue light emitting layer is provided to realize light having R, G, and B color by using a color conversion layer for converting a blue color into green and red colors.

According to an embodiment, the display panel 11 may be a flat display panel having a flat shape with a curvature of about zero. Since the above-described flat display panel 11 is curved by a separate frame having a curved shape, the flat display panel 11 may be maintained in a curved shape having a predetermined curvature R as described with reference to FIG. 1.

Figure 2:
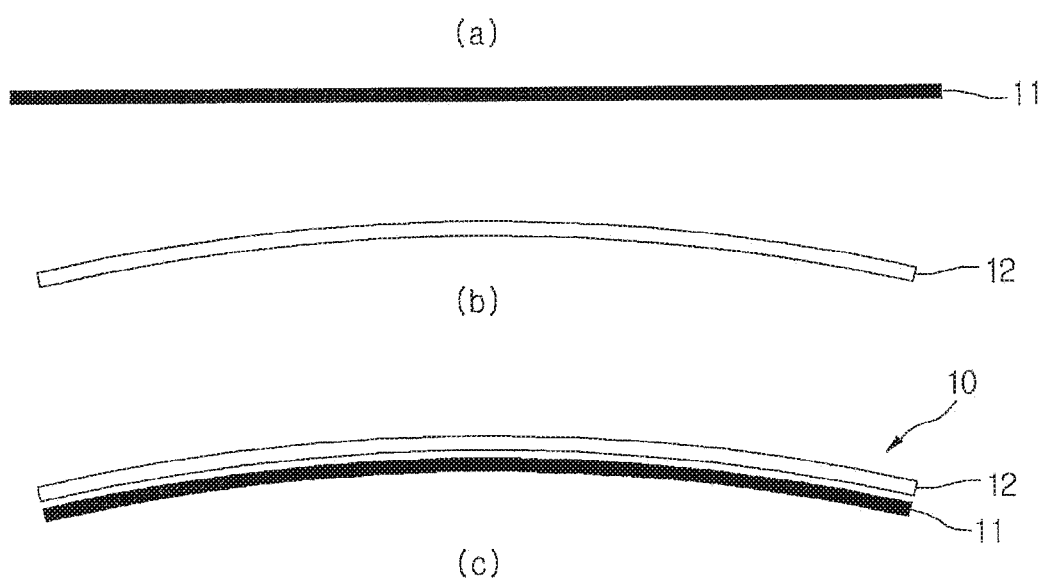
FIG. 2 is a cross-sectional view of a display apparatus according to an embodiment.

FIG. 2 is a cross-sectional view of a display apparatus according to an embodiment.

As shown in FIG. 2A, the display panel 11 may be a flat display panel. Also, as shown in FIG. 2B, a back cover 12 disposed on a rear side of the display panel 11 may have a structure with a curved shape of which both ends protrude forward.

Referring to FIG. 2C, since the back cover 12 having the curved shape as described above is disposed on the rear side of the display panel 11, the display panel may be curved in a shape corresponding to the curved shape of the back cover 12.

FIG. 2 illustrates the display panel 11 and the back cover 12 of the display apparatus 1 according to an embodiment. The display apparatus 1 may further include various components in addition to the display panel 11 and the back cover 12.

Also, the display apparatus 1 may further include a fixing part for fixing the back cover 12 so that the back cover 12 is maintained in the curved shape as shown in FIG. 2. Thus, since the back cover 12 is maintained in the curved shape, the display panel 11 disposed on a front side of the back cover may be maintained in the predetermined curvature as described with reference to FIG. 1.

Hereinafter, structures of the fixing part for fixing the curved shape of the back cover 12 according to embodiments will be described in detail with reference to FIGS. 3 to 30.

Figure 3:
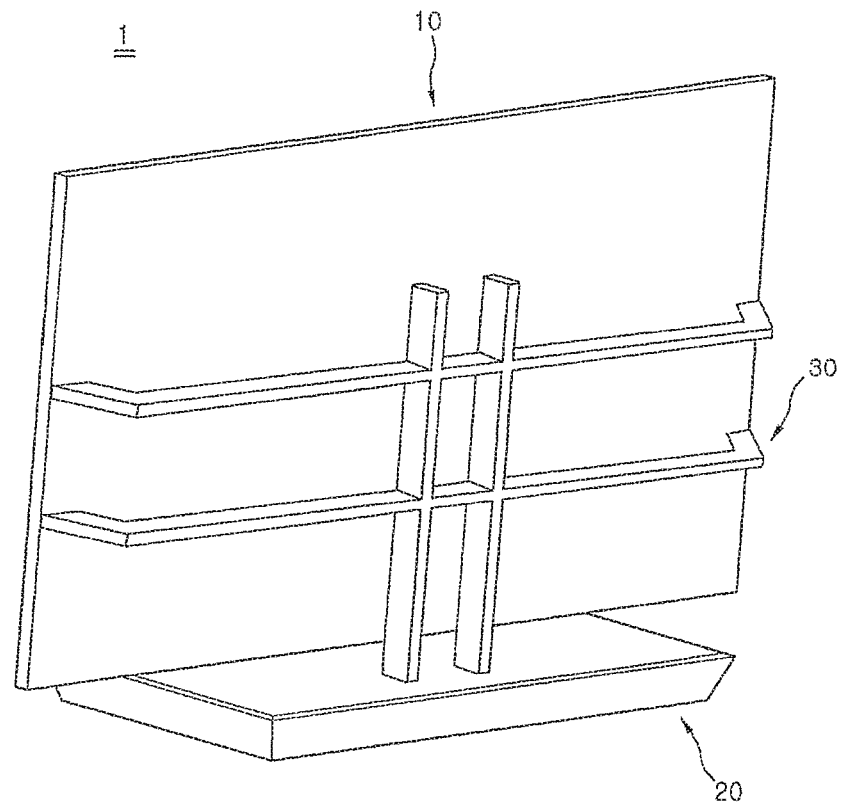
FIGS. 3 and 4 are views of a fixing part for maintaining a curved shape of a back cover according to an embodiment.

Referring to FIG. 3, the display apparatus 1 may include a display part for displaying an image, a control module 20 disposed outside the display part 10 to support the display part 10 with respect to the floor and generate a power and an image signal for operating the display part 10, and a support part 30 for supporting the display part to the control module 20.

For example, the control module 20 may include a power supply part receiving an external power to covert the external power into a driving power for driving the display part 10 and a main control part generating an image signal for driving the display part 10.

Also, the control module 20 may be provided as a part separated from the display part 10. The control module 20 may support the display part 10 with respect to the floor. Also, the control module 20 may additionally function as an AV box including a speaker and a signal input/output terminal.

For example, since the display part 10 according to the current embodiment does not include a separate power supply part or a main control part for processing an image signal, but includes a display module and protection members for fixing and protecting the display module, the display part 10 may be decreased in thickness.

As described with reference to FIGS. 1 and 2, the display part 10 may include the display panel 11 and the back cover 12 which have the curved shapes, respectively.

According to an embodiment, the support part 30 may function as the fixing part for maintaining the curved shape of the back cover 12.

For example, the support 30 may include at least one vertical bar extending vertically and at least one horizontal bar extending horizontally. The horizontal bar may be connected to both ends of the back cover 12.

Figure 4:
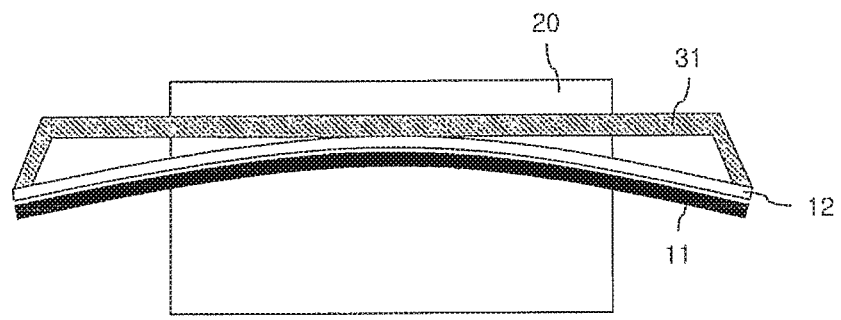

That is, as shown in FIG. 4, both ends of the horizontal bar 31 included in the support part 30 are connected to both outer portions of the back cover 12 to maintain the curved shape of the back cover 12. Thus, as shown in FIG. 1, the display panel 11 may also be maintained in the predetermined curvature R.

When the display apparatus 1 including the configuration as shown in FIG. 3 is fixed to a wall, the control module 20 may function as the fixing part for maintaining the curved shape of the back cover 12.

Figure 5:
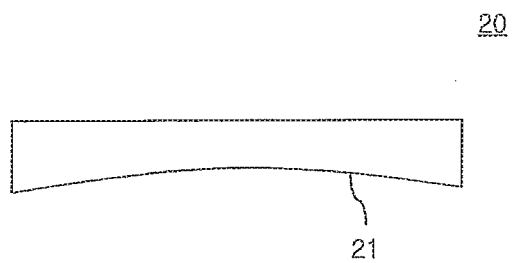
FIG. 5 is a view of a fixing part for maintaining a curved shape of a back cover according to another embodiment.

Referring to FIG. 5, one surface 21 of the control module 20 may have a shape corresponding to the curved shape of the back cover 12. In this case, the one surface 21 having the curved shape of both surfaces of the control module 20 may be attached to a back surface of the back cover 12 to maintain the curved shape of the back cover 12. Thus, the display panel 11 may also be maintained in the predetermined curvature R. A flat surface of both surfaces of the control module 20 may be fixed to the wall.

According to another embodiment, the fixing for fixing the curved shape of the back cover 12 may include a fixed member fixed to a central portion of the back cover 12, a cam member connected to the fixed member to move in front and rear directions, and a plate of which both ends are fixed to the back cover and a central portion is fixed to the fixed member to change a shape of the back cover according to the movement of the cam member.

Figure 6:
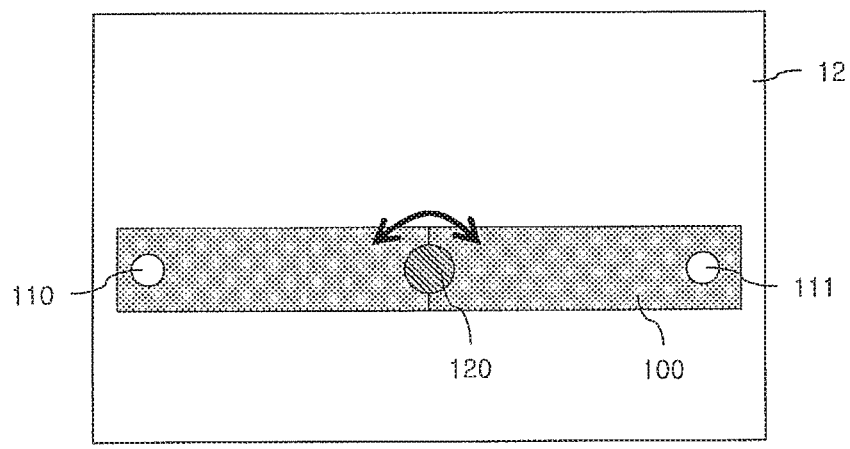
FIGS. 6 to 8 are views of a fixing part for maintaining a curved shape of a back cover according to another embodiment.
Figure 7:
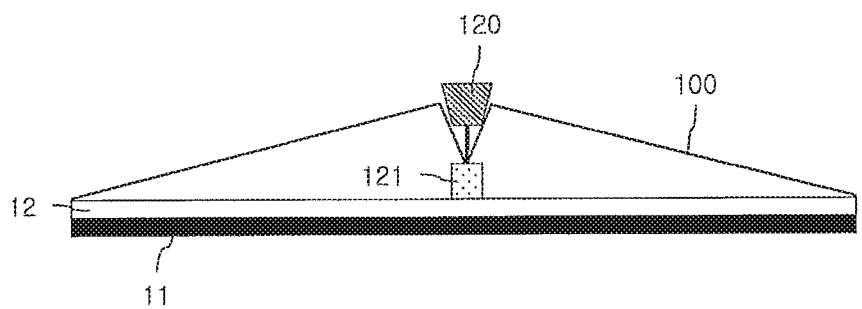

Referring to FIGS. 6 and 7, both ends of a plate 100 may be fixed to a back surface of the back cover 12 by using a plurality of coupling members 110 and 111. A central portion of the plate 100 may be bent at least two times so that the plate 100 has a structure in which the central portion thereof is inserted in a front direction (i.e., a direction toward the back cover 12).

Also, the forwardly inserted central portion of the plate 100 may be fixed by a fixed member 121 fixed to a central portion of a back surface of the back cover 12. A cam 120 is connected to the fixed member 121 to move in front and rear directions according to rotation thereof.

Figure 8:
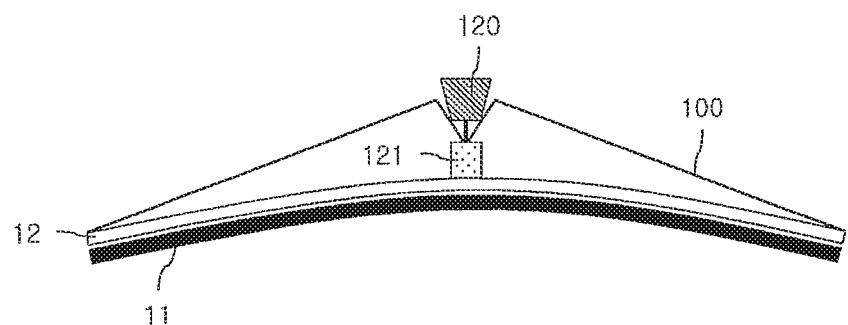

For example, as shown in FIG. 8, when the cam 120 is rotated in a first direction to move the cam 120 in a front direction, both ends of the plate 100 fixed to the back cover 12 may be moved inward so that the back cover 12 is curved to have a curved shape. Thus, the display panel 11 may also be curved in the predetermined curvature R.

Therefore, when the cam 120 is fixed in the state where the display panel 11 has a desired curvature R, each of the back cover 12 and the display panel 11 may be maintained in the correspondingly curved shape.

When the cam 120 is rotated in a second direction opposite to the first direction, the cam 120 is moved in a rear direction. As a result, both ends of the plate 100 fixed to the back cover 12 may be moved outward so that the curved shape of the back cover 12 becomes gradually flat. Thus, the curvature R of the display panel 11 may be gradually decreased.

According to another embodiment, the fixing for fixing the curved shape of the back cover 12 may include a fixed member fixed to a central portion of the back cover 12, a cam member connected to the fixed member to move in front and rear directions, and a plurality of plates having one end fixed to the back cover 12 and the other end contacting at least one of the fixed member and cam member to change a shape of the back cover according to the movement of the cam member.

Figure 9:
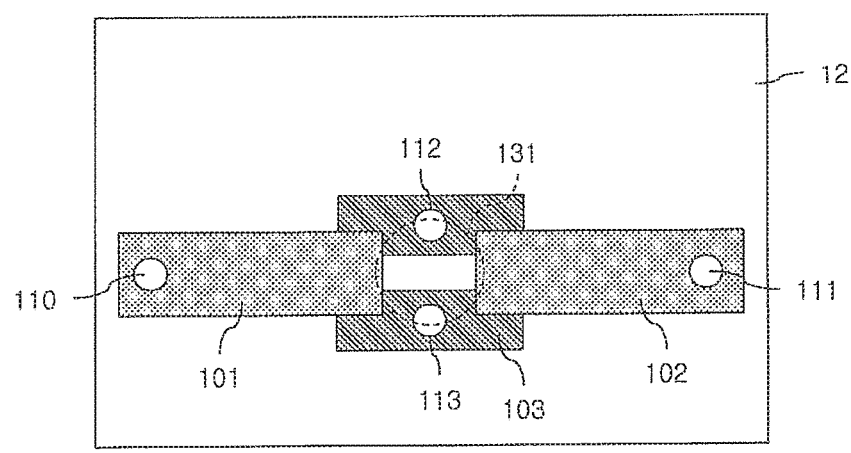
FIGS. 9 to 11 are views of a fixing part for maintaining a curved shape of a back cover according to another embodiment.
Figure 10:
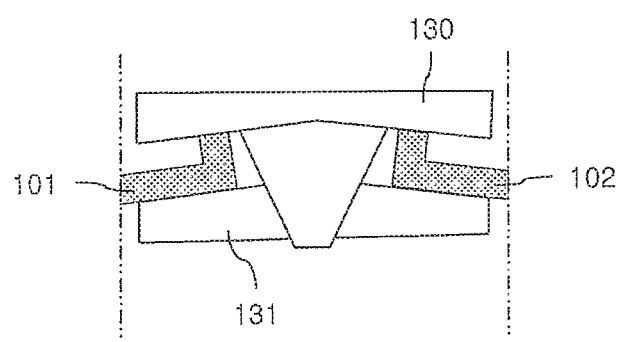

Referring to FIGS. 9 and 10, one end of a first plate 101 and one end of a second plate 102 may be fixed to a back surface of the back cover 12 by using a plurality of coupling members 110 and 111. The other ends of the first and second plates 110 and 102 which are not fixed to the back cover 12 may contact a cam 130 or a fixed member 131.

Also, a third plate 103 may be fixed to the back surface of the back cover 12 by using a plurality of coupling members 112 and 123. The fixed member 131 fixed to the back cover 12 may be disposed under the third plate 103.

Also, the cam 130 moved in front and rear directions according to rotation thereof may be disposed above the third plate 103. Thus, the cam 130 and the fixed member 131 may be connected to each other through a hole defined in the third plate 103.

Figure 11:
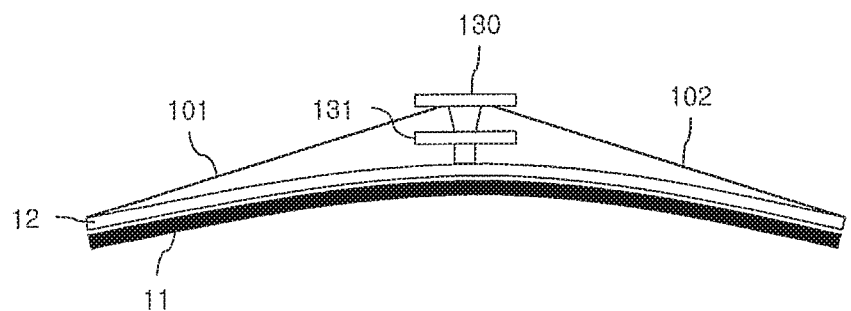

Referring to FIG. 11, when the cam 130 is rotated in one direction to move in a front direction, both ends of the first and second plates 101 and 102 fixed to the back cover 12 may be moved inward so that the back cover 12 is curved to have the curved shape. Thus, the display panel 11 may also be curved in the predetermined curvature R.

Therefore, when the cam 120 is fixed in the state where the display panel 11 has a desired curvature R, each of the back cover 12 and the display panel 11 may be maintained in the correspondingly curved shape.

According to another embodiment, the fixing part for fixing the curved shape of the back cover 12 may include a vertically movable moving member and a plurality of link members having one end fixed to the back cover 12 and the other end fixed to the moving member to change a shape of the back cover according to the movement of the moving member.

Figure 12:
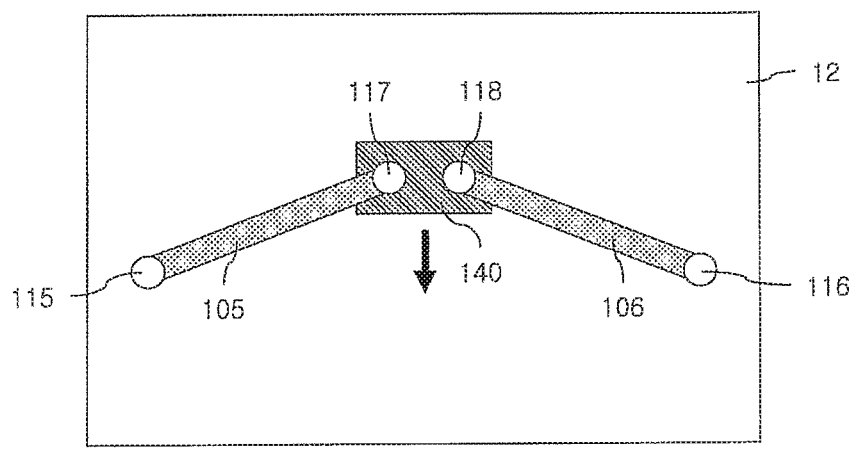
FIGS. 12 and 13 are views of a fixing part for maintaining a curved shape of a back cover according to another embodiment.

Referring to FIG. 12, one end of a first link 105 and one end of a second link 106 may be fixed to a back surface of the back cover 12 by using a plurality of coupling members 115 and 116. The other ends of the first and second links 105 and 106 which are not fixed to the back cover 12 may be fixed to a vertically movable moving member 140 by using a plurality of coupling members 117 and 118.

Figure 13:
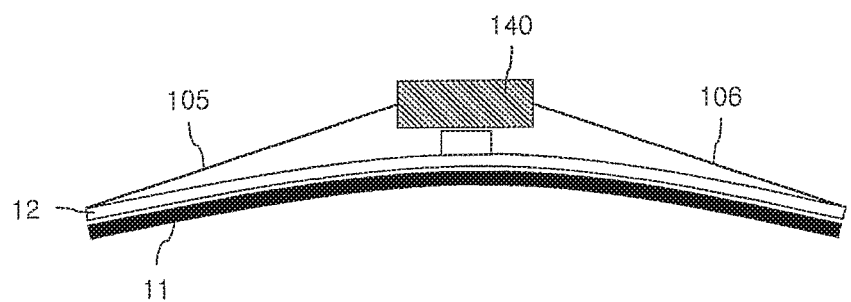

Referring to FIG. 13, when the moving member 140 is moved in one direction, both ends of the first and second links 105 and 106 fixed to the back cover 12 may be moved inward so that the back cover 12 is curved to have the curved shape. Thus, the display panel 11 may also be curved in the predetermined curvature R.

Therefore, when the cam 120 is fixed in the state where the display panel 11 has a desired curvature R, each of the back cover 12 and the display panel 11 may be maintained in the correspondingly curved shape.

As described with reference to FIGS. 6 to 13, the fixing part may be automatically operated by a separate driving part (not shown). For example, the rotation of the cam member and the movement of the moving member which are included in the fixing part may be performed by an operation of a motor included in the driving part.

The operation of the motor may be controlled by a user's input, and the user may adjust a desired curvature R of the display panel 11. More particularly, the more a watching position P is away from the display panel 11, the more a curvature R of the display panel 11 is decreased.

According to another embodiment, the fixing part for fixing the curved shape of the back cover 12 may include a rotation member rotated by an operation of a motor and a chain member fixed to a back surface of the back cover 12 and having a side connected to the rotation member to change a change of the back cover 12 according to the rotation of the rotation member.

Figure 14:
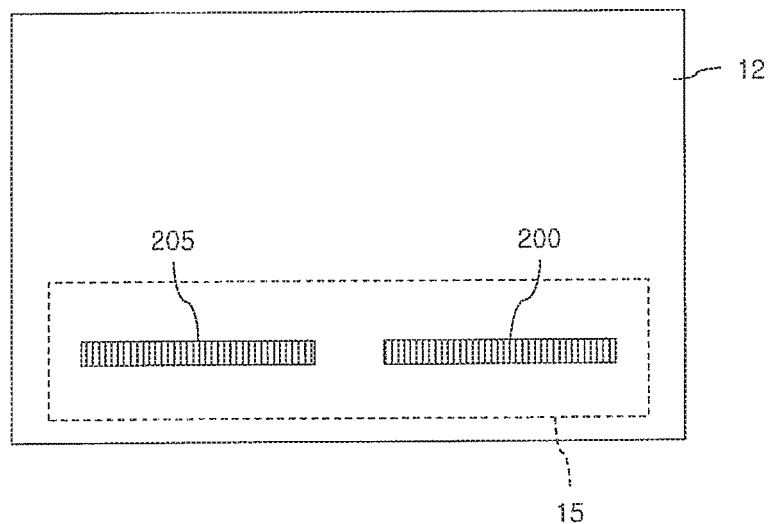
FIGS. 14 and 15 are views of a fixing part for maintaining a curved shape of a back cover according to another embodiment.

Referring to FIG. 14, a plurality of chains 200 and 201 may be fixed to the back surface of the back cover 12. An area on which the chains 200 and 201 are attached may be areas on which a rear cover 15 covering a lower end area of the back cover 12 is disposed. Thus, the chains 200 and 201 may not be exposed to the outside.

When the chains 200 and 201 are pulled or released by the operation of the motor, a curved shape of the back cover 12 may be changed. Thus, the display panel 11 may be adjusted in curvature R.

Figure 15:
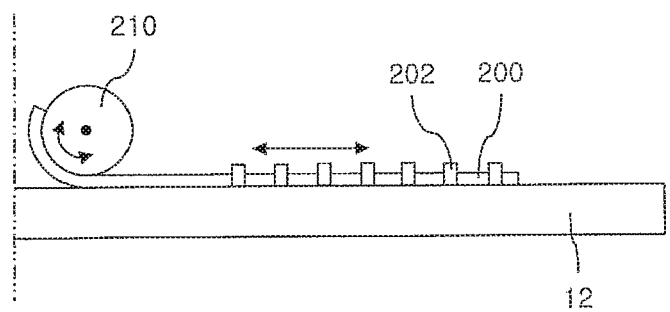

Referring to FIG. 15, one end of the chain 200 may be connected to the rotation member 210 rotated by the motor, and at least one portion of the remaining portions of the chain 200 may be hooked and fixed to a guide rib 202 disposed on the back surface of the back cover 12.

When the rotation member 210 is rotated in one direction (for example, a clockwise direction), the chain 201 hooked and fixed to the guide rib 202 may be pulled so that the back cover 12 is curved to have a curved shape. Thus, the display panel 11 may be curved to have a predetermined curvature R.

Although the chains 200 and 201 are fixed to the lower end area of the back cover 12 in the current embodiment, the present disclosure is not limited thereto. For example, the chains 200 and 201 may be additionally provided on an upper area of the back surface of the back cover 12.

Figure 17:
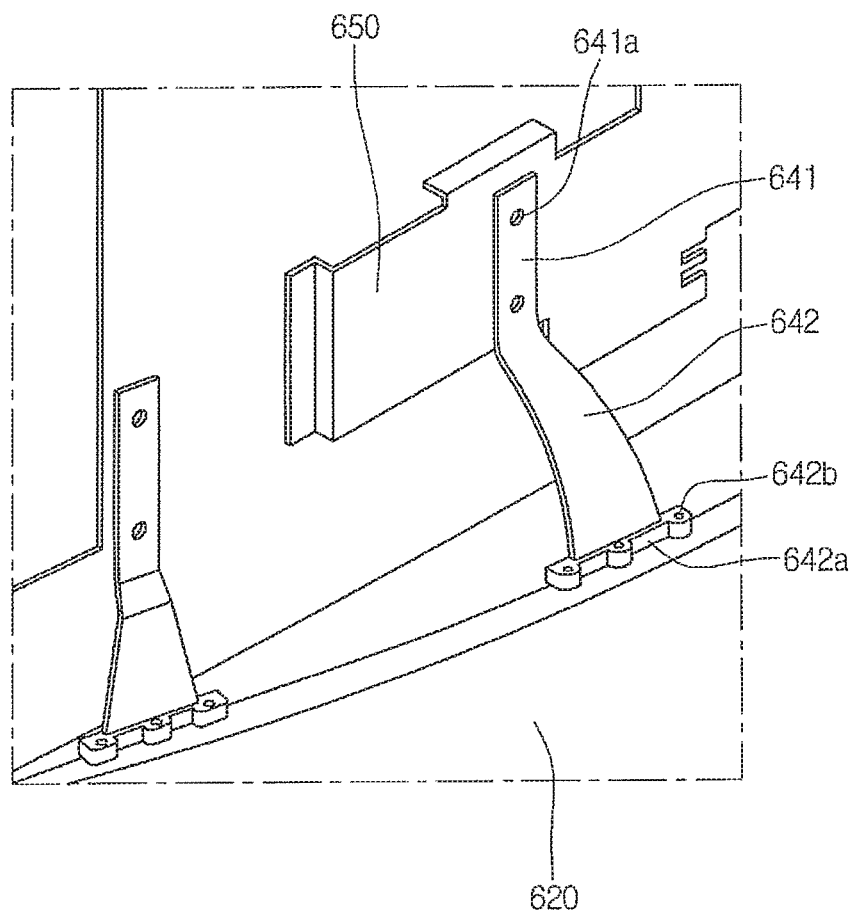
FIG. 17 is an enlarged view of a portion of FIG. 16.
Figure 18:
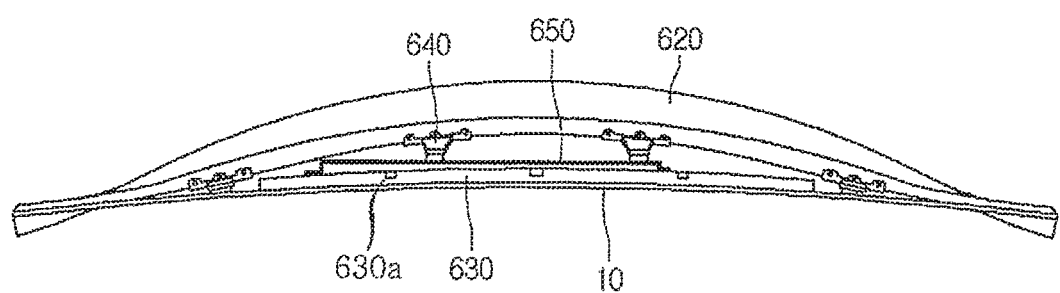
FIG. 18 is a plan view of FIG. 16.

Hereinafter, configurations of a display apparatus including a fixing part according to another embodiment will be described in more detail with reference to FIGS. 16 to 18.

Figure 16:
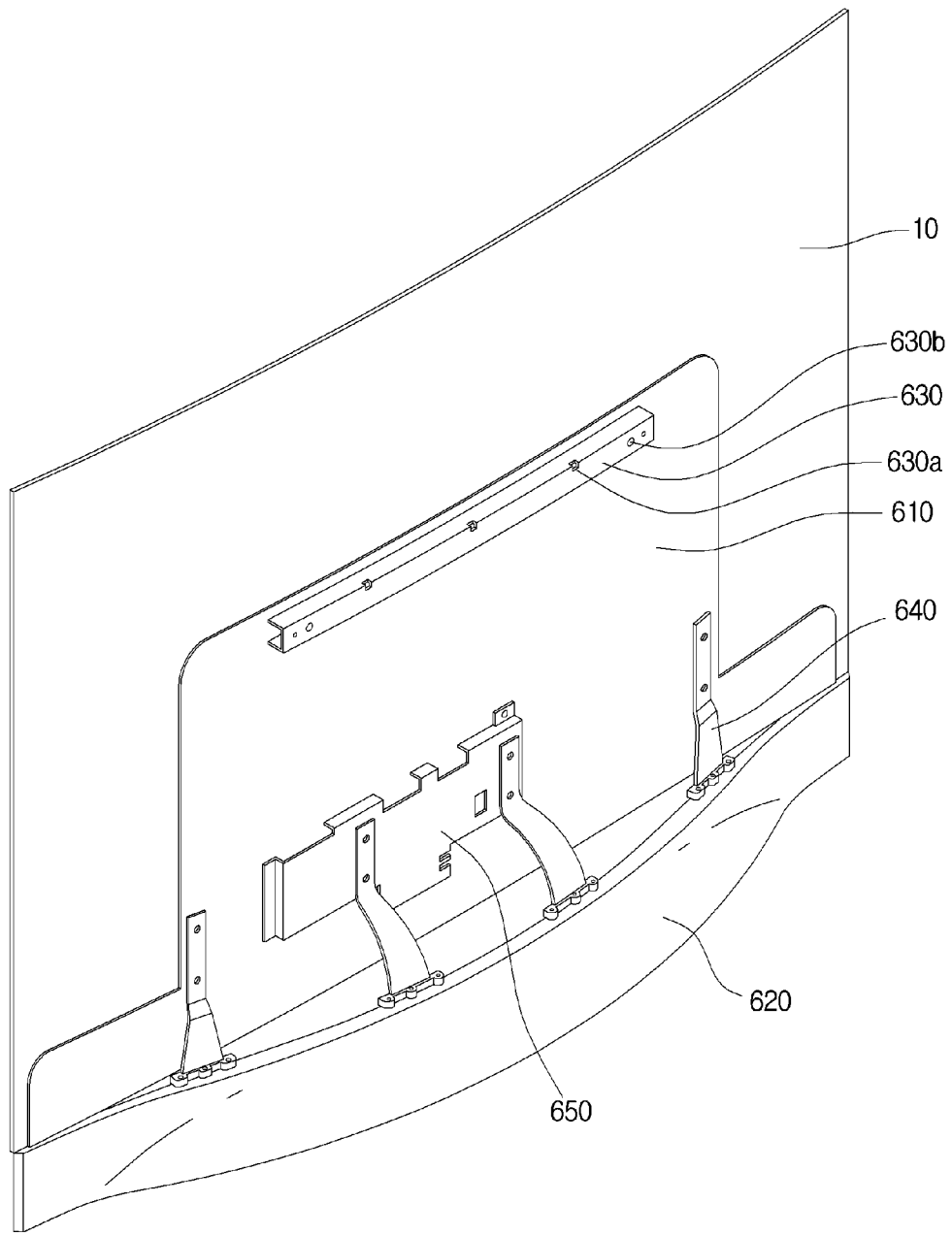
FIG. 16 is a perspective view of a fixing part for maintaining a curved shape of a back cover according to another embodiment.

FIG. 16 is a schematic perspective view of a back surface of a display apparatus according to an embodiment. FIG. 17 is an enlarged view of a portion of FIG. 16, and FIG. 18 is a plan view of FIG. 16.

A fixing part according to the current embodiment includes a plate 610 disposed on a rear side of a display part 10, a stand 620 supporting the display part 10 so that the display part 10 stands up, a stand support 640 connecting the stand 620 to the plate 610, and a fixing bar 630 coupled to a rear side of the plate 610.

In detail, the plate 610 is formed of a metal material and attached to a back surface of a back cover 12.

The stand 620 is disposed on a lower portion of the display part 10. The stand 620 may have a shape in which a central portion of the stand 620 protrudes backward. Thus, a distance between the stand 620 and the display part 10 or the plate 610 is further at the central portion and closer at both left and right ends.

For example, the stand 620 may be curved as if the stand 620 protrude forward from both left and right thereof ends and relatively recessed backward from the central portion thereof.

In this case, a curved degree of the stand 620 may be greater than that of the display part 10. That is, the stand 620 may have a curvature greater than that of the display part 10.

Since the stand 620 has the above-described structure, points of both left and right ends of the stand 620 are coupled to points of left and right ends of the display part 10, and the central portion of the stand 620 is spaced backward from the display part 10.

The stand 620 may have a rounded shape on the whole. Also, the stand 620 may be manufactured by injection-molding a synthetic resin.

The stand support 640 may be coupled to the stand 620 and the plate 610 to maintain the curved shapes of the display part 10 and the plate 610.

That is, the central portion of the curved plate 610 may be moved toward forward to fix the plate 610, thereby preventing the display part 10 from being spread in a flat shape.

For this, the stand support 640 includes a plate coupling part 641 extending approximately in a vertical direction and a stand coupling part 642 disposed on a lower portion of the plate coupling part 641 to extend backward in a shape inclined gradually toward a lower side thereof.

A plurality of through holes passing through the plate coupling part 641 in front and rear directions are defined in the plate coupling part 641. The through holes may be holes through which bolts for coupling the plate 610 pass.

Thus, the stand support 640 may surface-contact the plate 610 through the plate coupling part 641 to restrict the movement of the central portion of the plate 610 in a front direction. Here, the plate coupling part 641 may be directly coupled to the back surface of the back cover 12.

A horizontal extension part 642a horizontally extending backward from a lower end of the stand coupling part 642 is disposed on the lower end of the stand coupling part 642. Also, a plurality of through holes 642b vertically passing through the horizontal extension part 642a are defined horizontally in the horizontal extension part 642a. The through holes 642b may be holes through which bolts for coupling the stand support 640 to the stand 620 pass.

The plate coupling part 641 may be integrated with the stand coupling part 642. Also, each of the plate coupling part 641 and the stand coupling part 642 may be formed of a metal having high hardness without elastic deformation.

The stand support 640 may be provided in plurality, and the plurality of stand supports 640 may be arranged in left and right directions. The stand support 640 disposed close to each of left and right edges may have a front/rear length less than that of the stand support disposed on a central portion.

For example, two central stand supports 640 and two side stand supports 640 may be symmetrically disposed with respect to a center of a left/right direction. Here, each of the side stand supports 640 may have a front/rear distance less than that of each of the central stand support 640. For this, the stand coupling part 642 may have a shorter length. Also, the stand coupling part 642 may be inclined to be substantially vertical.

The fixing bar 630 is coupled to a rear side of an upper portion of the plate 610. The fixing bar 630 may be a high hardness member extends horizontally. The fixing bar 630 may fix the plate 610 so that the plate 610 is maintained in the curved shape. The fixing bar 630 may be, for example, formed of titanium or carbon steel.

For this, the fixing bar 630 may have a curved shape corresponding to shapes of the plate 610 and the display part 10, and include slits 630a that allow the fixing bar to be easily curved. That is, the fixing bar 630 may have a shape which relatively protrudes forward at left and right ends thereof and relatively protrudes backward at a central portion thereof.

Here, the fixing bar 630 may have a curved shape on the whole. Alternatively, the fixing bar 630 may have a shape of which only a front surface is curved and a back surface is not curved, i.e., have a straight line shape on the whole.

The fixing bar 630 may be coupled to the plate 610 using a screw bolt. The fixing bar 630 may include one or more holes 630b to enable the fixing bar to receive screws, bolts, or the like.

A reference numeral 650 represents a rear cover 650 coupled to a rear side of the plate 620. The plate coupling part 641 of the stand support 640 may be coupled to a back surface of the rear cover 650 or a back surface of the plate 620. Also, the plate coupling part 641 may be directly coupled to the back surface of the back cover 12.

Thus, the display part 10 may be maintained in the curved shape by the fixing part to improve the user's immersion.

Figure 19:
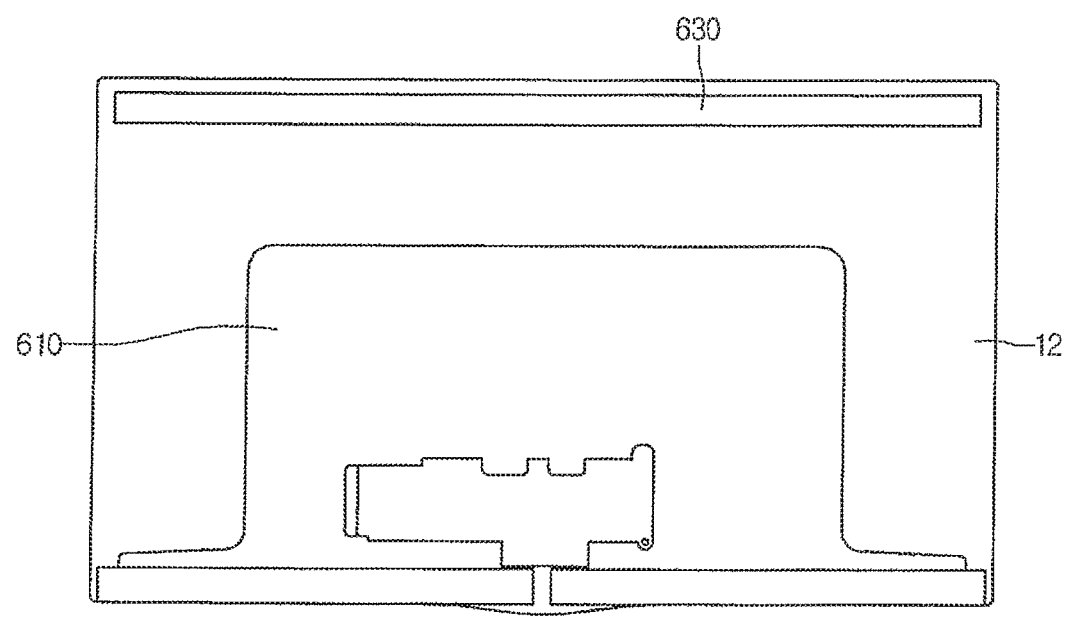
FIG. 19 is a view illustrating a back surface of a display part to which a fixing bar is coupled according to an embodiment.
Figure 20:
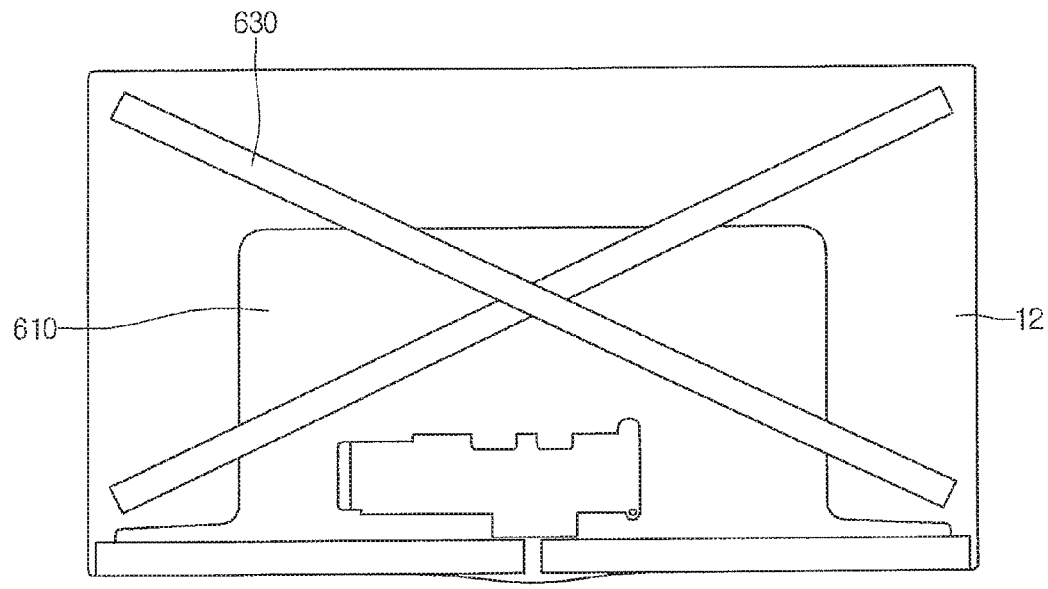
FIG. 20 is a view illustrating a back surface of a display part to which a fixing bar is coupled according to another embodiment.
Figure 21:
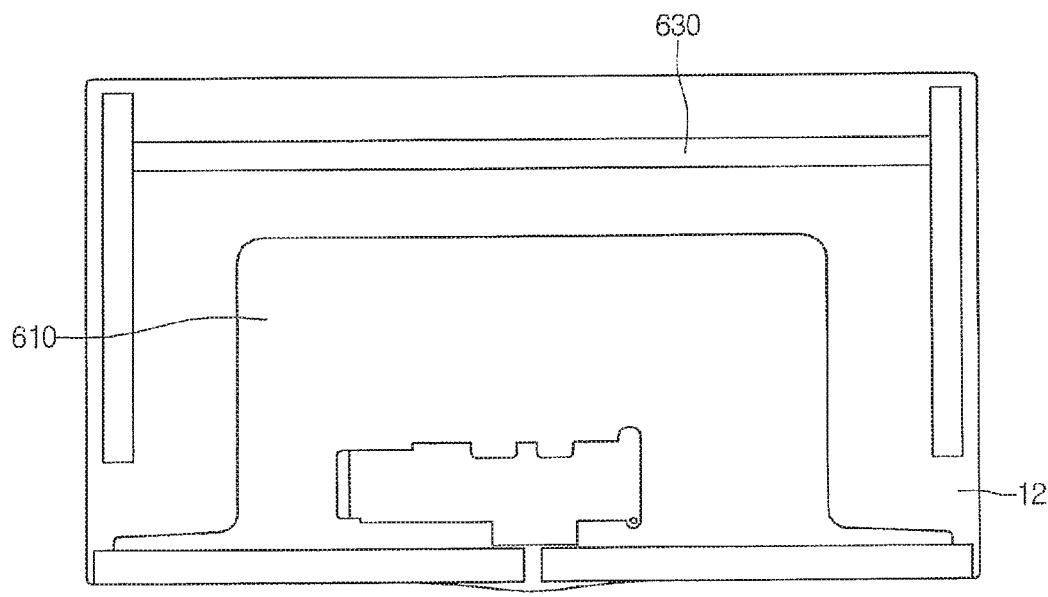
FIG. 21 is a view illustrating a back surface of a display part to which a fixing bar is coupled according to another embodiment.

The fixing bar 630 may have a shape as shown in FIGS. 19 to 21.

FIGS. 19 to 21 illustrate a back surface of the display apparatus in which fixing bars having different shapes are respectively disposed at different positions.

Referring to FIG. 19, the fixing bar 630 may extend longitudinally in left and right directions. Also, the fixing bar 630 may be directly coupled to an upper end of a back surface of the back cover 12. Here, the fixing bar 630 may be provided in plurality. The plurality of fixing bars 630 may be vertically disposed parallel to each other.

Referring to FIG. 20, the fixing bars 630 may be coupled to the back surface of the display part 10 in a diagonal shape crossing each other. One fixing bar 630 extends from a left upper end of the back surface of the display part 10 up to a right lower end, and the other fixing part extends a right upper end of the back surface of the display part 10 up to a left lower end.

Referring to FIG. 21, the fixing bar 630 may be provided in plurality. The plurality of fixing bars 630 may be coupled to the back surface of the display part 10. Here, a portion of the fixing bars 630 may extend in a horizontal direction, and a remaining portion may extend in a vertical direction.

FIGS. 22 to 25 illustrate a fixing part according to another embodiment. Referring to FIGS. 22 to 25, a fixing part may further include a middle cover formed of a high hardness material.

Figure 22:
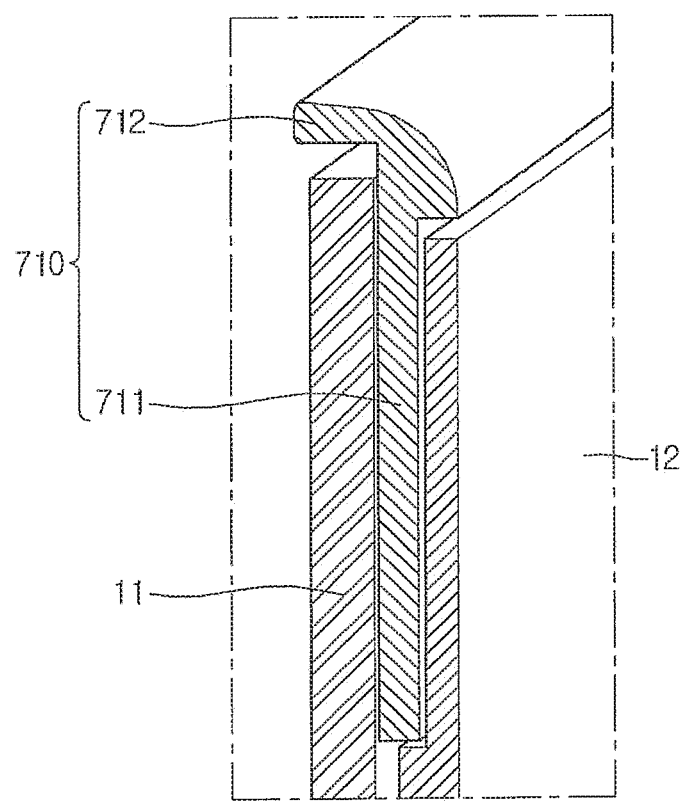
FIG. 22 is a cross-sectional perspective view of a fixing part for maintaining a curved shape of a back cover according to another embodiment.

FIG. 22 is a cross-sectional perspective view of a display apparatus including a middle cover 710 according to an embodiment and illustrates a portion of an upper end of the display apparatus.

The middle cover 710 may have a portion disposed between a display panel 11 and a back cover 12. The middle cover 710 may be formed of a material having high hardness such as titanium or carbon steel to maintain curved states of the display panel 11 and the back cover 12. For this, the middle cover 710 may have a curved shape of which both left and right ends relatively protrudes forward, and a central portion relatively protrudes backward.

The middle cover 710 includes an insertion part 711 inserted between the display panel 11 and the back cover 12 and an end cover part 712 coupled to an outer end of the insertion part 711 to extend in front and rear directions approximately perpendicular to an extension direction of the insertion part 711.

An outer surface of the end cover part 712 may surround an outer end of the display part 10. Also, for an elegant outer appearance, the outer surface of the end cover part 712 may be rounded. An inner surface of the end cover part 712 may be stepped at front and rear portions thereof with respect to the insertion part 711.

A space in which the insertion part 711 is inserted may be defined in a central portion in a front/rear direction at an edge of the display part 10. That is, a portion of the central portion in the front/rear direction at the edge of the display part 10 may be recessed inward to define a groove.

The groove may have a narrow width in a front/rear direction at an edge of the back cover 12. That is, a front surface of the back cover 12 may be stepped. The stepped portion of the back cover 12 may be the groove in which the insertion part 711 is inserted.

The middle cover 710 may be disposed on only an upper end of the display part 10. Alternatively, the middle cover 710 may be disposed on upper and lower ends or on ends in up/down right/left directions. When the middle cover 710 is disposed on the upper and lower ends of the display part 10, the middle cover 710 may be curved in a front direction. Also, when the middle cover 710 is disposed on the left and right ends of the display part 10, the middle cover may have a shape which extends in a straight line shape without being curved. Since the middle cover 710 is coupled to the edge of the display part 10 to protect the end of the display part 10 and realize the elegant outer appearance, the middle cover 710 may be disposed on the left and right ends without being curved.

Figure 23:
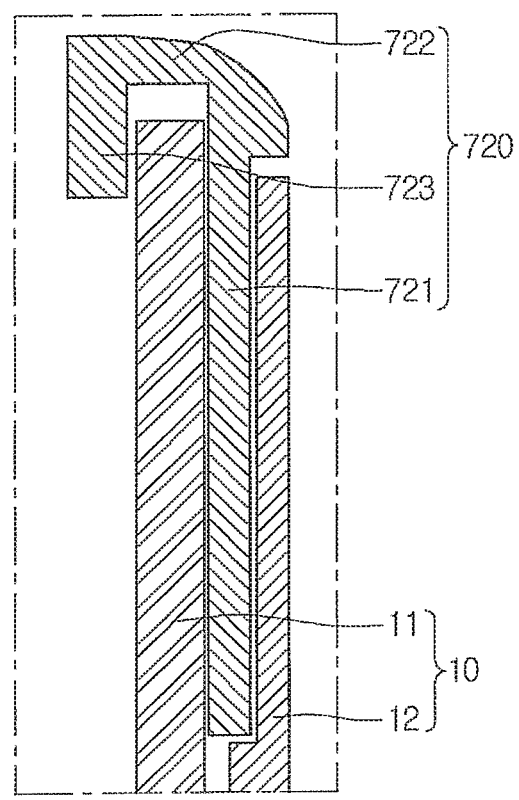
FIG. 23 is a cross-sectional perspective view of a fixing part for maintaining a curved shape of a back cover according to another embodiment.
Figure 24:
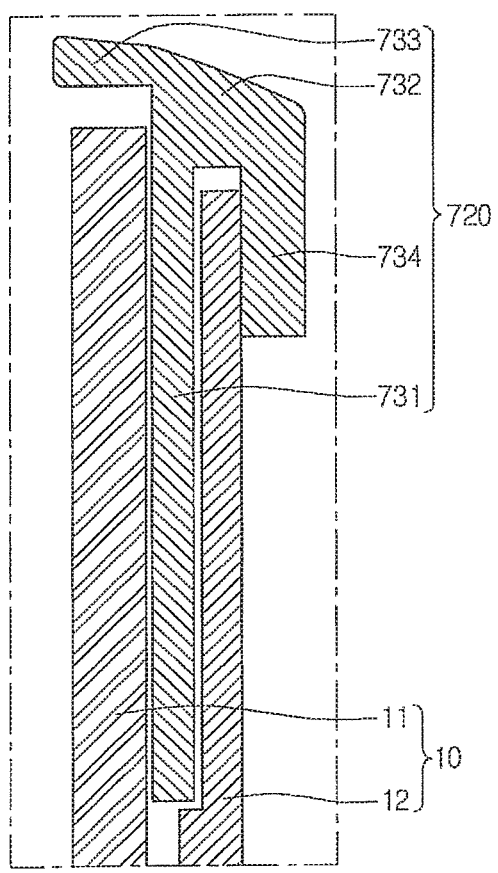
FIG. 24 is a cross-sectional perspective view of a fixing part for maintaining a curved shape of a back cover according to another embodiment.
Figure 25:
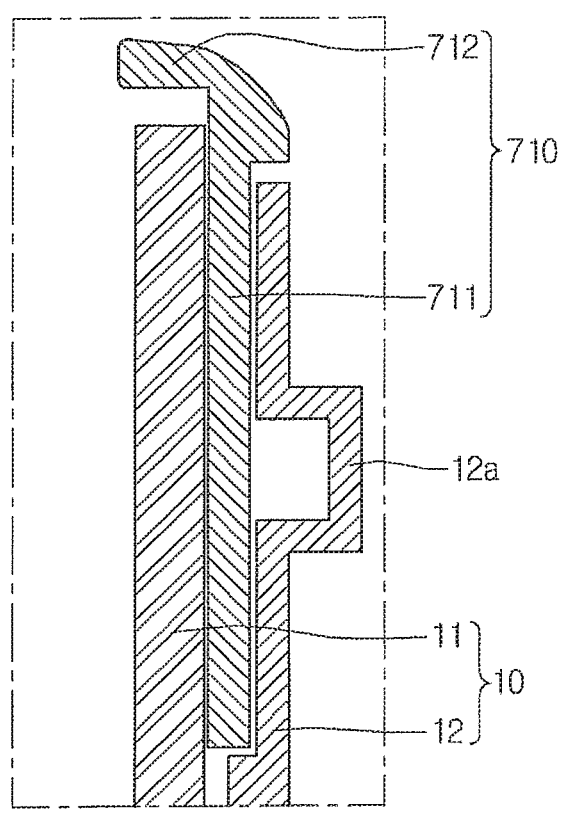
FIG. 25 is a cross-sectional perspective view of a fixing part for maintaining a curved shape of a back cover according to another embodiment.

As shown in FIGS. 23 to 25, the middle cover may be modified in shape.

FIG. 23 is a cross-sectional view illustrating a modified shape of the middle cover.

Referring to FIG. 23, the middle cover 720 includes an insertion part 721 inserted into the display part 10, an end cover part 722 coupled to an outer end of the insertion part 721 to extend in front and rear directions approximately perpendicular to an extension direction of the insertion part 721, and a front extension part 723 extending inward from a front end of the end cover part 722 in a direction approximately parallel to the insertion part 721.

When compared to the example illustrated in FIG. 22, the middle cover 720 is equal to that of FIG. 22 except that the middle cover 720 includes the front extension part 723. Thus, their duplicated descriptions will be omitted.

Since the front extension part 723 is provided, a larger force for maintaining the curved state of the display part 10 may be obtained. In addition, it may prevent foreign substances from being introduced through the end of the display part 10.

FIG. 24 is a cross-sectional view illustrating another modified shape of the middle cover.

Referring to FIG. 24, the middle cover 730 includes an insertion part 731 inserted into the display part 10, an end cover part 722 coupled to an outer end of the insertion part 731 to extend in front and rear directions approximately perpendicular to an extension direction of the insertion part 731, and a rear extension part 733 extending inward from a rear end of the end cover part 732 in a direction approximately parallel to the insertion part 731.

When compared to the example illustrated in FIG. 22, the middle cover 733 is equal to that of FIG. 22 except that the middle cover 720 includes the rear extension part 733. Thus, their duplicated descriptions will be omitted.

Since the rear extension part 733 is provided, a large force for maintaining the curved state of the display part 10 may be obtained.

FIG. 25 is a cross-sectional view of a structure in which a rib 12a is disposed on a back cover 12 coupled to a rear side of a middle cover 710.

Referring to FIG. 25, the rib 12a protruding backward is disposed on an edge of the back cover 12a. The rib 12a longitudinally extends in left and right directions. The rib 12a may prevent the back cover 12 from being deformed in a direction perpendicular to the extension direction of the rib 12a. Thus, a larger force for preventing the curved state of the display part 10 from being spread may be obtained. In an example illustrated in FIG. 26, other configurations except for the rib 12a are equal to those of the example illustrated in FIG. 24, and thus, their duplicated descriptions will be omitted.

Hereinafter, portions of configurations included in the display apparatus except for the display part 10 and the fixing part will be described with reference to FIGS. 26 to 30.

Figure 26:
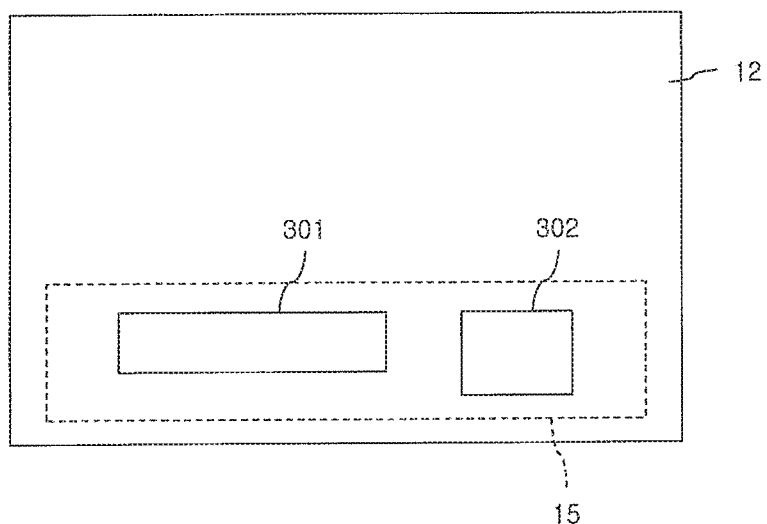
FIG. 26 is a view of a back surface of a back cover according to an embodiment.

FIG. 26 is a view of a back surface of a back cover according to an embodiment.

Referring to FIG. 26, a plurality of driver ICs 301 and 302 for controlling a display panel 11 may be disposed on area of a back surface of a back cover 12 curved by a rear cover 15. The driver ICs 301 and 302 may be realized on a printed circuit board (PCB).

As shown in FIGS. 1 to 25, when the back cover 12 and the display panel 11 have curved shapes, respectively, the PCB disposed on the back surface of the back cover 12 may be fixed to the back cover 12 by using a separate bracket.

Figure 27:
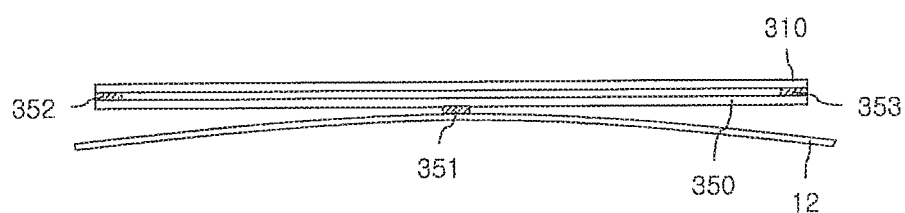
FIG. 27 is a cross-sectional view illustrating a coupling surface between a back cover and a printed circuit board according to an embodiment.

Referring to FIG. 27, a bracket 350 is disposed between the back cover 12 and the PCB 310. The back cover 12 and the bracket 350 may be coupled to each other at a central portion therebetween by using a first coupling member 351.

Also, the PCB 310 and the bracket 350 may be coupled to each other at both outer portions thereof by using a second coupling member 352 and a third coupling member 353.

Thus, the PCB 310 may be stably fixed to the back cover without being curved along the curved shapes of the display panel 11 and the back cover 12.

Figure 28:
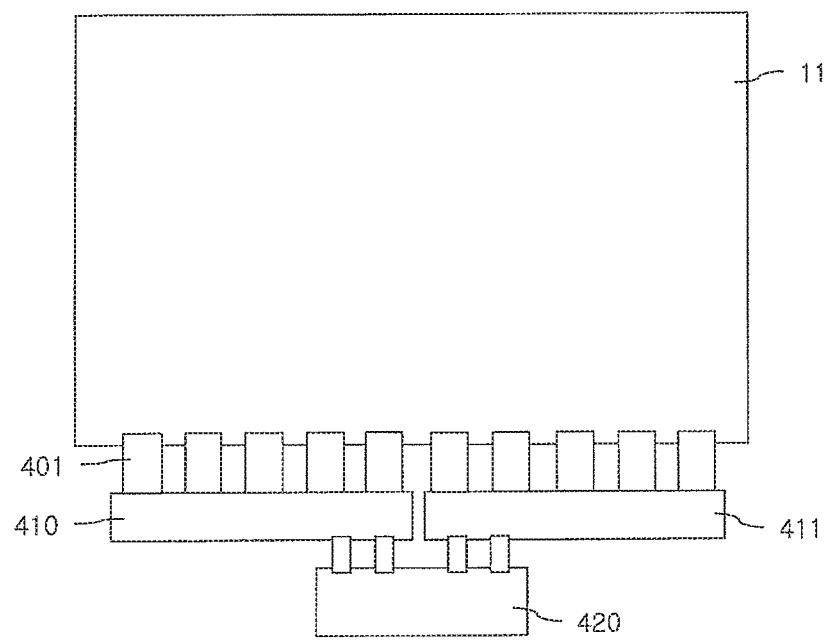
FIGS. 28 and 29 are views illustrating a connection method of a driver IC according to an embodiment.
Figure 29:
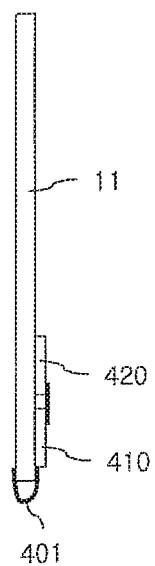

FIGS. 28 and 29 are views illustrating a connection method of the driver IC according to an embodiment.

Referring to FIG. 28, a display panel 11 may be connected to driver ICs, e.g., a left S-PCB 410 and a right PCB 411 by using a flexible printed circuit board (FPCB) 401. Also, the driver ICs 410 and 411 may be connected to a T-Con board 420.

Also, as shown in FIG. 29, the driver ICs 410 and 411 and the T-Con board 420 may be fixed to a back surface of the display panel 11.

Figure 30:
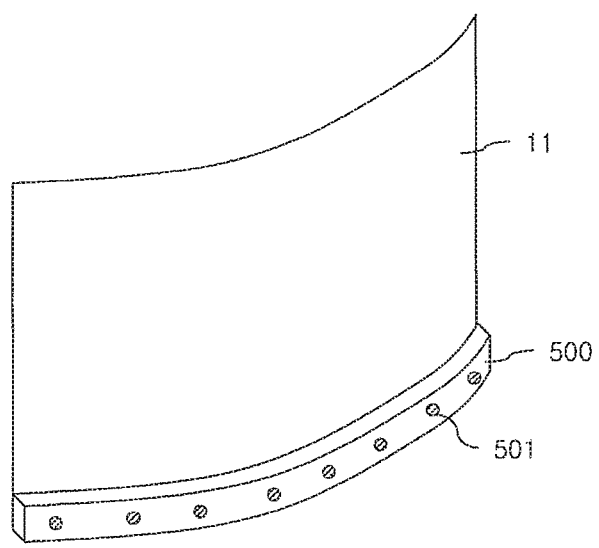
FIG. 30 is a view of a back surface of a display panel according to an embodiment.

Referring to FIG. 30, a curved bar 500 having a curved shape corresponding to that of the display panel 11 may be attached to an area of the back surface of the display panel 11 on which the driver ICs 410 and 411 and the T-Con board 420 are disposed.

The curved bar 500 may maintain the curved shape of the display panel 11. In addition, the curved bar 500 may perform a heat dissipation function for releasing heat generated in the driver ICs 410 and 411 and the T-Con board 420 to the outside.

To improve the heat dissipation function, the curved bar 500 may be connected to the back cover 12.

For example, a plurality of holes 501 may be defined in the curved bar 500, and the back cover 12 and the curved bar 500 may be coupled to each other by using a coupling member such as a bolt though the plurality of holes 501 defined in the curved bar 500.

According to the embodiments, since the flat display panel is curved to have a predetermined curvature by using a back cover having a curved shape, the user's immersion may be improved when the user watches various images such as the 3D image.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. Therefore, contents with respect to various variations and modifications will be construed as being included in the scope of the present disclosure.

What is claimed is:

1. A display apparatus, comprising:
    a display module, the display module including:
        a display panel having a curved shape; and
        a back cover disposed behind the display panel and having a curved shape corresponding to the curved shape of the display panel; and
    a fixing bar horizontally disposed behind the back cover and having a curved shape corresponding to the curved shape of the back cover,
    wherein the fixing bar has a cross-section in a vertical direction that includes a plurality of sections which are bent relative to each other, the plurality of sections of the fixing bar extending horizontally in the curved shape of the back cover, and wherein the fixing bar includes one or more slits to enable the fixing bar to be easily curved,
    wherein the back cover includes a rib that protrudes backwards to have a convex shape, and wherein the rib is provided at a position apart from an upper end of the back cover towards a center of the back cover, and extends in the horizontal direction having the curved shape of the back cover, and
    wherein one of the plurality of sections of the fixing bar forms a back surface of the fixing bar, and wherein the one or more slits is a notch at a longitudinal edge of the back surface of the fixing bar such that the one or more slits is disposed horizontally along the back cover.

2. The display apparatus of claim 1, wherein the fixing bar includes one or more holes to enable the fixing bar to receive screws or bolts.

3. The display apparatus of claim 1, wherein the rib protrudes to have a plurality of surfaces that form the concave shape.

4. The display apparatus of claim 1, wherein the rib has a cross-section in a vertical direction that includes a plurality of bent portions.

5. The display apparatus of claim 4, wherein the plurality of bent portions of the rib includes:
    a first bent portion in which a portion of the back cover is bent backward to form a first side surface of the rib;
    a second bent portion which is vertically bent at an end of the first bent portion to form a back surface of the rib; and
    a third bent portion which is bent at an end of the second bent portion to form a second side surface of the rib opposite the first side surface.

6. The display apparatus of claim 1, wherein the fixing bar is fixed to the back cover.

7. The display apparatus of claim 6, wherein the fixing bar includes:
    a first portion that defines one surface of the fixing bar;
    a second portion bent at a first end of the first portion; and
    a third portion bent at a second end of the first portion.

8. The display apparatus of claim 7, wherein one or both of the second portion and the third portion are configured to contact the back cover.

9. The display apparatus of claim 7, wherein the ends of the second and third portions of the fixing bar are curved along the back cover, and the first portion is configured to be planar.

10. The display apparatus of claim 1, further comprising a rear cover disposed behind the back cover.

11. The display apparatus of claim 10, further comprising a supporting unit that supports the display module such that the display module stands up on an installation surface,
    wherein one end of the supporting unit is fixed to the rear cover or the back cover, and the other end of the supporting unit is placed on the installation surface.

12. The display apparatus of claim 11, wherein the other end of the supporting unit has a curved shape.

13. The display apparatus of claim 11, wherein the supporting unit includes a supporter of which one end is fixed to the rear cover or the back cover.

14. The display apparatus of claim 13, wherein the supporting unit further includes a stand placed on the installation surface,
    wherein the other end of the supporter is coupled to the stand.

15. The display apparatus of claim 14, wherein the stand is configured to be curved in such a manner that a central portion of the stand protrudes backwards.

16. The display apparatus of claim 15, wherein a curvature of the stand is greater than a curvature of the display module.

17. The display apparatus of claim 1, further comprising a PCB coupled to the back cover and having a planar shape.

18. The display apparatus of claim 17, further comprising:
    a bracket to which the PCB is coupled;
    a first coupling member that couples the bracket to the back cover; and
    a second coupling member that couples the PCB to the bracket,
    wherein the bracket is coupled to the back cover such that the bracket has a planar shape.

19. A display apparatus, comprising:
a display module, the display module including:
- a display panel having a curved shape; and
- a back cover disposed behind the display panel and having a curved shape corresponding to the curved shape of the display panel; and
- a fixing bar horizontally disposed behind the back cover and having a curved shape corresponding to the curved shape of the back cover,
- wherein the fixing bar has a cross-section in a vertical direction that includes a plurality of sections which are bent relative to each other, the plurality of sections of the fixing bar extending horizontally in the curved shape of the back cover, and wherein the fixing bar includes one or more slits to enable the fixing bar to be easily curved, and
- wherein the back cover includes a rib that protrudes backwards to have a convex shape, and wherein the rib is provided at a position apart from an upper end of the back cover towards a center of the back cover, and extends in the horizontal direction having the curved shape of the back cover,
- a rear cover disposed behind the back cover; and
- a supporting unit that supports the display module such that the display module stands up on an installation surface,
- wherein one end of the supporting unit is fixed to the rear cover or the back cover, and the other end of the supporting unit is placed on the installation surface,
- wherein the supporting unit includes
  - a supporter of which one end is fixed to the rear cover or the back cover, and
  - a stand placed on the installation surface,
  - wherein the other end of the supporter is coupled to the stand, and
  - wherein the supporter includes:
  - a plate coupling part directly coupled to the back cover; and
  - a stand coupling part that extends at a lower end of the plate coupling part and coupled to the stand.

* * * * *